US012563705B2

(12) United States Patent
Oh et al.

(10) Patent No.: US 12,563,705 B2
(45) Date of Patent: Feb. 24, 2026

(54) HEAT EXCHANGE DEVICE USING SEAWATER

(71) Applicant: Seung Jae Oh, Jeollanam-do (KR)

(72) Inventors: Seung Jae Oh, Jeollanam-do (KR);
Jeong Seok Ha, Gwangju (KR)

(73) Assignee: Seung Jae OH, Jeollanam-do (KR)

( * ) Notice: Subject to any disclaimer, the term of this
patent is extended or adjusted under 35
U.S.C. 154(b) by 331 days.

(21) Appl. No.: 18/023,726

(22) PCT Filed: Nov. 27, 2020

(86) PCT No.: PCT/KR2020/017180

§ 371 (c)(1),
(2) Date: Feb. 28, 2023

(87) PCT Pub. No.: WO2022/045465

PCT Pub. Date: Mar. 3, 2022

(65) Prior Publication Data

US 2024/0040752 A1 Feb. 1, 2024

(30) Foreign Application Priority Data

Aug. 28, 2020 (KR) ........................ 10-2020-0109302
Sep. 21, 2020 (KR) ........................ 10-2020-0121448

(51) Int. Cl.
*H05K 7/20* (2006.01)
(52) U.S. Cl.
CPC ................................ *H05K 7/20763* (2013.01)
(58) Field of Classification Search
CPC ............ H05K 7/20763; H05K 7/14337; F28D
1/0426; F28D 9/0018; F28D 9/00; F25B
39/02; F25B 13/00; F25B 43/00; F28F
1/325
See application file for complete search history.

(56) References Cited

U.S. PATENT DOCUMENTS

2012/0103578 A1* 5/2012 Taylor .................... F28F 3/083
165/157
2016/0381840 A1* 12/2016 Peterson ........... H05K 7/20709
62/260

FOREIGN PATENT DOCUMENTS

JP 2580003 B2 2/1997
JP 6397267 B2 9/2018
KR 10-0968114 B1 7/2010
KR 10-2012-0102419 A 9/2012
KR 10-2018-0077461 A 7/2018
(Continued)

OTHER PUBLICATIONS

Pdf is translation of foreign reference KR 20200022980 A (Year: 2020).*

(Continued)

*Primary Examiner* — Len Tran
*Assistant Examiner* — Kamran Tavakoldavani
(74) *Attorney, Agent, or Firm* — Revolution IP, PLLC

(57) ABSTRACT

The present disclosure provides a heat exchange device using seawater including: a body portion having a hollow shape; a pillar portion which is disposed inside the body portion and has a hollow shape, in which the data center servers are installed, and into which seawater flows; and the first cover portion to which one end of the pillar portion is coupled, and which is detachably installed at one end of the body portion.

25 Claims, 16 Drawing Sheets

100

(56)     References Cited

FOREIGN PATENT DOCUMENTS

| KR | 10-2020-0022980 A | | 3/2020 | |
|---|---|---|---|---|
| KR | 20200022980 A | * | 3/2020 | ............ F24F 5/0046 |

OTHER PUBLICATIONS

International Search Report for PCT/KR2020/017180 mailed May 26, 2021 from Korean Intellectual Property Office.

* cited by examiner

100

200

200

112          110          112

200

1100

1200

<u>1200</u>

HEAT EXCHANGE DEVICE USING SEAWATER

TECHNICAL FIELD

The present disclosure relates to a heat exchange device using seawater, and more particularly, to a heat exchange device for cooling servers of data center using seawater.

BACKGROUND

In general, a data center is a facility that collects equipment that needs to provide IT services, such as a server, a network, and a storage, in one place, and operates 24 hours a day, 365 days a year. The data center is a space that handles operations such as an Internet search, e-mail account, and online shopping. Since these functions are paralyzed if the power supply is interrupted even for a moment, the data center is equipped with a spare power supply device and spare data communication equipment. In addition, since heat is emitted from computer equipment, it is important for the data center to have cooling facilities, and fire extinguishing facilities and security devices are additionally provided.

On the other hand, a submerged data center device may use seawater to cool equipment such as the server. In this case, accessibility of an operator to the data center device should be easy.

In addition, the data center can be cooled by using seawater. In this case, it is necessary to develop a heat exchange device having a structure in which the seawater can flow smoothly so that the seawater flowed into the heat exchange device can appropriately exchange heat with the data center.

SUMMARY OF INVENTION

Technical Problem

The present disclosure is developed for the above-mentioned necessity, and an object of the present disclosure is to provide easy accessibility of an operator to a submerged data center device and a heat exchange device using seawater.

Another object of the present disclosure is to provide a heat exchange device using seawater that can effectively cool servers of a data center disposed therein using seawater introduced therein.

Solution to Problem

The present disclosure provides a heat exchange device using seawater including: a body portion having a hollow shape; a pillar portion which is disposed inside the body portion and has a hollow shape, in which the data center servers are installed, and into which seawater flows; and a first cover portion to which one end of the pillar portion is coupled, and which is detachably installed at one end of the body portion.

The first cover portion may be formed in a hemispherical shape.

The first cover portion may be provided with a first cover hole communicating with an inside of the pillar portion.

The heat exchange device using seawater according to the present disclosure may further include a second cover portion which is coupled to the other end of the body portion and into which a second cover hole communicating with the inside of the pillar portion is formed.

The pillar portion may be formed in a prism shape and be provided with the data center servers on an outer surface.

The heat exchange device using seawater according to the present disclosure may further include an auxiliary flow path portion which is installed on an outer peripheral surface of the body portion and has a hollow shape, and through which the seawater flows in and out.

The heat exchange device using seawater according to the present disclosure may further include a cover flange portion installed between the first cover portion and the pillar portion; and a body flange portion installed at one end of the body portion and coupled to the cover flange portion.

The heat exchange device using seawater according to the present disclosure may further include a hollow-shaped auxiliary heat exchanger which is installed on an outside of the data center servers with respect to a radial direction of the body portion and into which the seawater flowed into the auxiliary flow path portion selectively flows.

The data center servers may be stacked in multiple stages in the radial direction of the body portion, and the auxiliary heat exchanger may be disposed between the data center server and the data center server adjacent to each other with respect to the radial direction of the body portion.

The heat exchange device using seawater according to the present disclosure may further include an auxiliary connection portion which connects the auxiliary heat exchanger and the auxiliary heat exchanger adjacent to each other in a circumferential direction of the body portion, and in which the data center servers are installed radially outer side when viewed in an axial direction of the body portion.

The heat exchange device using seawater according to the present disclosure may further include a seating portion installed on the outside of the data center server with respect to the radial direction of the body portion; and a heat transfer portion installed on an outside of the seating portion and inserted into the auxiliary flow path portion.

The heat transfer portion may include a fin member inserted to the outside the seating portion; and a heat pipe installed on a side surface of the fin member when viewed in the axial direction of the body portion.

When viewed from the side surface of the heat transfer portion, the fin member may be formed in a shape protruding from the seating portion in the axial direction of the body portion. The heat pipe may include a first pipe member inserted into the seating portion and extending in the radial direction of the body portion; and a second pipe member connected to a radially outer end of the first pipe member and extending in the axial direction of the body portion.

The heat transfer portion may further include a head member coupled to a radially outer end of the fin member and having a reference width in the circumferential direction of the body portion, which is larger than the fin member. A radially outer end of the heat pipe may be inserted into a radially inner portion of the head member.

In addition, the present disclosure provides a heat exchange device using seawater including: a body portion; a pillar portion which is accommodated inside the body portion and has a hollow shape, into which seawater flows, and in which a data center servers are installed; an auxiliary flow path portion installed on an outer surface of the body portion and having a hollow shape; and a connection portion accommodated inside the body portion, installed at one end of the auxiliary flow path portion, and supplying the seawater to the data center.

The data center servers may be stacked in multiple stages on an outside of the pillar portion with respect to a radial direction of the body portion. The heat exchange device

3 using seawater according to the present disclosure may further include an auxiliary supply portion installed between the data center server and the data center server adjacent to each other with respect to the radial direction of the body portion, and having one end connected to the connection portion.

The auxiliary flow path portion may include a first auxiliary flow path portion and a second auxiliary flow path portion disposed with the body portion interposed therebetween. The connection portion may include a first connection portion and a second connection portion respectively installed in the first auxiliary flow path portion and the second auxiliary flow path portion. The auxiliary supply portion may include a first auxiliary supply portion and a second auxiliary supply portion respectively connected to the first connection portion and the second connection portion.

The first connection portion and the second connection portion may be in communication with one end of the first auxiliary flow path portion and one end of the second auxiliary flow path portion, respectively. The heat exchange device using seawater according to the present disclosure may further include a communication pipe portion which communicates the other end of the first auxiliary supply portion and the other end of the second auxiliary supply portion with each other, and is disposed to surround an outer surface of the other end side of the pillar portion. The seawater flowed into one end of the first auxiliary flow path portion may sequentially flow along the first connection portion, the first auxiliary supply portion, the communication pipe portion, the second auxiliary supply portion, the second connection portion, and the second auxiliary flow path portion, and then be discharged to the sea.

The first connection portion may communicate with one end of the first auxiliary flow path portion. The heat exchange device using seawater according to the present disclosure may further include: a first communication pipe portion for communicating the other end of the first auxiliary flow path portion and the other end of the first auxiliary supply portion with each other. The seawater flowed into one end of the first auxiliary flow path portion may sequentially flow along the first connection portion, the first auxiliary supply portion, the first communication pipe portion, and the other end of the first auxiliary flow path portion, and then is discharged to the sea.

The data center servers may be stacked in three or more layers. Two or more, that is, a plurality of the auxiliary supply portions may be provided.

The heat exchange device using seawater according to the present disclosure may further include a heat sink installed on an outer surface of the data center servers disposed at the outermost side with respect to the radial direction of the body portion; and a cooling fan installed on the heat sink for cooling the heat sink.

The heat exchange device using seawater according to the present disclosure may further include a distribution heat exchanger installed in the auxiliary supply portion. The distribution heat exchanger may include a distribution block having a plurality of distribution members in an inner space, and a distribution pipe which is connected to the distribution block and through which the seawater flows in and out.

The heat exchange device using seawater according to the present disclosure may further include a first communication pipe portion communicating with the other end of the first auxiliary supply portion and installed at the other end of the first auxiliary flow path portion; and a closed flow path portion accommodated inside the first auxiliary flow path portion communicating the first connection portion and the first communication pipe portion with each other. The seawater flowed into one end of the first auxiliary flow path portion may flow along an outer surface of the closed flow path portion and then is discharged to the sea through the other end of the first auxiliary flow path portion. The seawater present inside the closed flow path portion may circulate along the first connection portion, the first auxiliary supply portion, the first communication pipe portion, and the closed flow path portion.

The heat exchange device using seawater according to the present disclosure may further include a pump installed in the first communication pipe portion and pressurizing the seawater circulating along the first connection portion, the first auxiliary supply portion, the first communication pipe portion, and an inside of the closed flow path portion.

The heat exchange device using seawater according to the present disclosure may further include a plurality of heat exchange protrusion portions installed on an outer surface of the closed flow path portion and spaced apart from each other in a circumferential direction of the closed flow path portion.

The heat exchange protrusion portion may include a protrusion member protruding outward in the radial direction of the closed flow path portion; and a plurality of auxiliary protrusion members protruding from an outer surface of the protrusion member.

The protrusion member may be formed in a shape in which a reference width of the closed flow path portion in the circumferential direction gradually decreases toward the radial outer side of the closed flow path portion.

Advantageous Effects of Invention

According to the heat exchange device using seawater according to the present disclosure, in a state where the pillar portion, in which the data center servers are installed, is accommodated inside the body portion, and one end of the pillar portion is coupled to the first cover portion, the first cover portion is detachably installed to the body portion. Therefore, if necessary, the first cover portion and the pillar portion are drawn out of the body portion so that the operator can access the data center servers, which has the advantage that the operator can easily access the data center to handle the failure thereof.

In addition, according to the heat exchange device using seawater according to the present disclosure, the pillar portion, on which the data center servers are installed, is disposed inside the body portion, the auxiliary flow path portion is installed on the outer surface of the body portion, and the connection portion inside the body portion is connected to the auxiliary flow path portion. Therefore, the seawater flowing into the pillar portion from the sea can cool the data center servers, and at the same time, the seawater flowing into the auxiliary flow path portion and the connection portion from the sea can cool the data center servers, thereby effectively cooling the entire data center.

BRIEF DESCRIPTION OF DRAWINGS

FIG. 8 is viewed from a side.

BEST MODE FOR INVENTION

Figure 1:
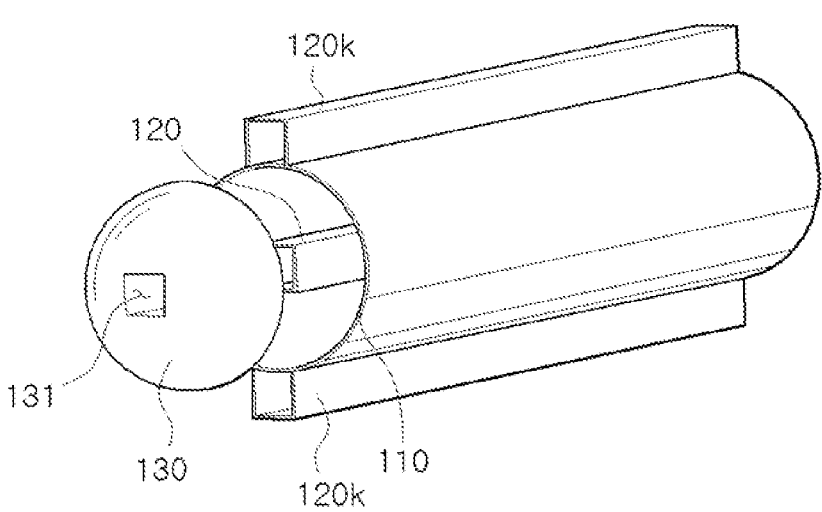
FIG. 1 is a perspective view of a heat exchange device using seawater according to a first embodiment of the present disclosure.

Although the present disclosure is described with reference to the embodiments shown in the drawings which are merely exemplary, it will be understood by those skilled in the art that various modifications and equivalent other embodiments are possible therefrom. Therefore, the true technical protection scope of the present disclosure should be determined by the technical spirit of the appended claims.

Referring to FIG. 1, a heat exchange device 100 using seawater according to a first embodiment of the present disclosure includes a body portion 110, an auxiliary flow path portion 120k, a pillar portion 120, a first cover portion 130, and a second cover portion 140.

The body portion 110 is formed in a hollow cylindrical shape. The auxiliary flow path portion 120k is installed on an outer circumferential surface of the body portion 110 and extends in an axial direction of the body portion 110. In addition, the auxiliary flow path portion 120k has a hollow shape and the seawater flows therein.

Figure 5:
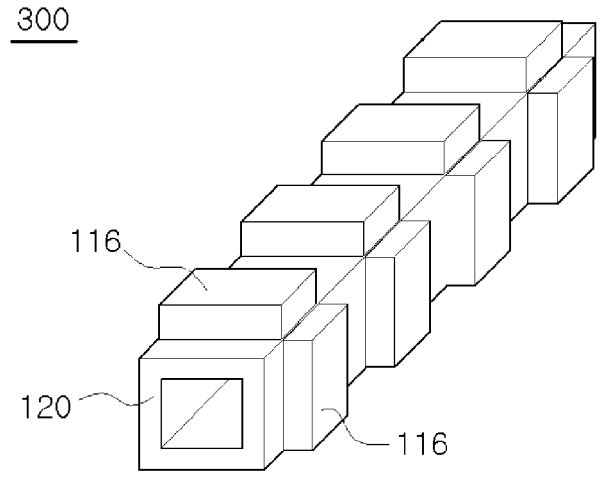
FIG. 5 is a view showing a state where data center servers are installed in a pillar portion in a third embodiment of the present disclosure.
Figure 6:
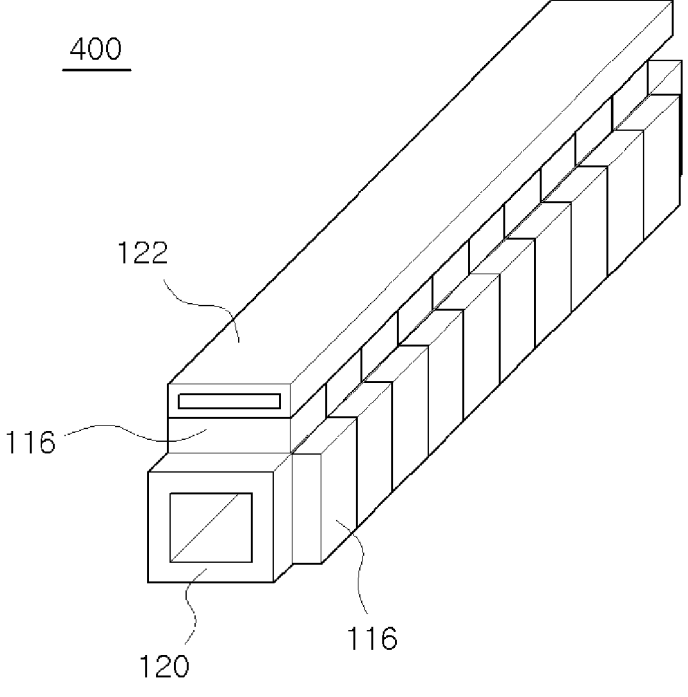
FIG. 6 is a view showing a state where the data center servers and an auxiliary heat exchanger are installed on a pillar portion in a fourth embodiment of the present disclosure.
Figure 7:
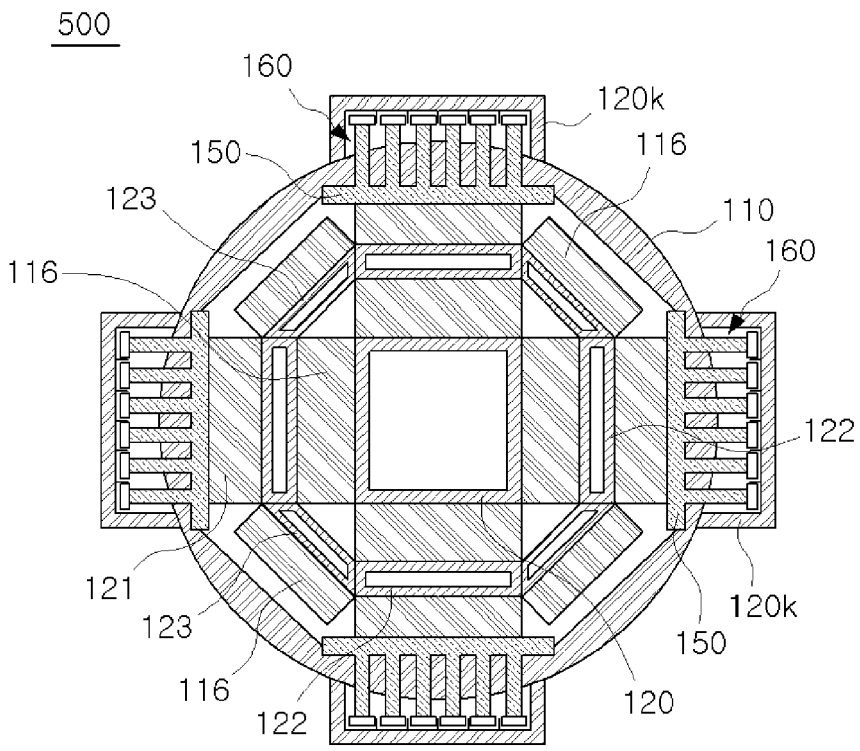
FIG. 7 is a view showing a state where data center servers are stacked in multiple stages and an auxiliary heat exchanger is installed between the data center servers in a fifth embodiment of the present disclosure.

The pillar portion 120 is disposed inside the body portion 110 and has a hollow shape, and the seawater flows therein. As shown in FIGS. 5 to 7, a plurality of data center servers 116 are installed on an outer surface of the pillar portion 120. In this case, as shown in FIG. 1, the pillar portion 120 may be formed in a prism shape but is not limited thereto.

The first cover portion 130 is coupled to one end of the pillar portion 120 and is detachably installed at one end of the body portion 110. In more detail, the first cover portion 130 has a first cover hole 131 formed through a center thereof and communicates with the inside of the pillar portion 120. The seawater flows into the pillar portion 120 from the sea through the cover hole 131. As shown in FIG. 1, the first cover portion 130 may have a hemispherical shape, but is not limited thereto. On the other hand, although not shown in FIG. 1, the second cover portion 140 shown in FIG. 4 may also be provided in the first embodiment of the present disclosure. The second cover portion 140 is detachably installed at the other end of the body portion 110 and a second cover hole 141 communicating with the inside of the pillar portion 120 is formed. Therefore, the seawater flowed into the inside of the pillar portion 120 through the first cover hole 131 may cool the data center server 116 and then be discharged to the sea through the second cover hole 141.

The seawater flowed into the inside of the pillar portion 120 cools the data center server 116 installed on the outer surface of the pillar portion 120. On the other hand, although not shown in FIG. 1, separate supply means (not shown) for supplying the seawater flowing into the auxiliary flow path portion 120k to the data center server 116 is provided, and the data center server 116 can be additionally cooled.

According to the heat exchange device 100 using seawater according to the present disclosure as described above, in a state where the pillar portion 120, in which the data center server 116 is installed, is accommodated inside the body portion and one end of the pillar portion 120 is coupled to the first cover portion 130, the first cover portion 130 is detachably installed on the body portion 110. Therefore, if necessary, the first cover portion 130 and the pillar portion 120 are withdrawn to the outside of the body portion 110, an operator can access the data center server 116, and thereby it has an advantage that the operator can easily access the data center server 116.

Hereinafter, heat exchange devices 200, 300, 400, 500, and 600 using seawater according to the second to the sixth embodiments of the present disclosure will be described with reference to FIGS. 2 to 10. At this time, only portions that are different from those of the first embodiment of the present disclosure will be described.

Figure 2:
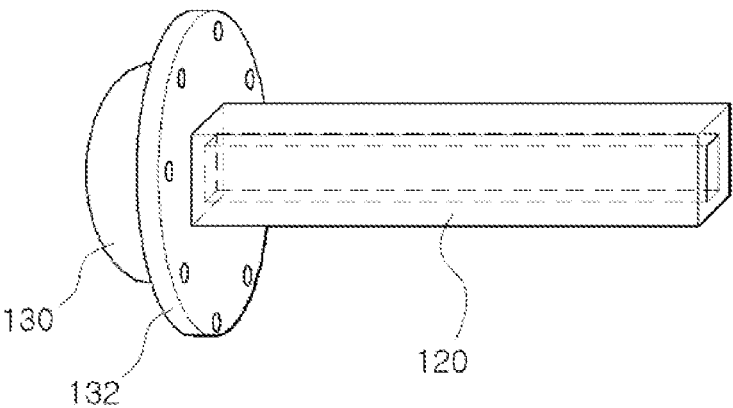
FIG. 2 is a perspective view of a pillar portion, a first cover portion, and a cover flange portion in a second embodiment of the present disclosure.
Figure 3:
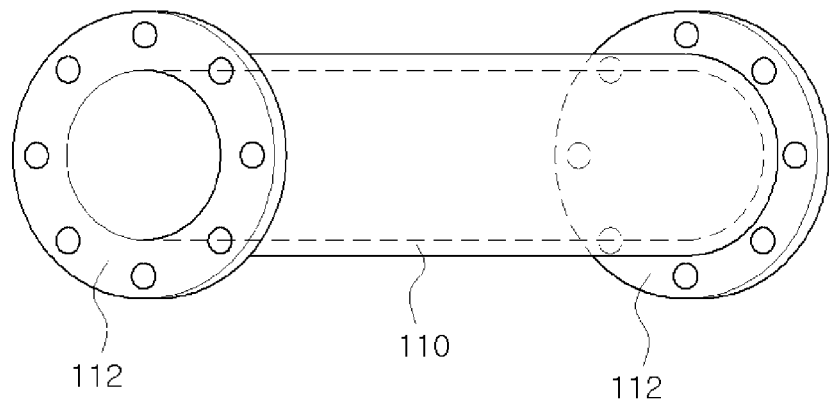
FIG. 3 is a perspective view of a body portion and a body flange portion in the second embodiment of the present disclosure.
Figure 4:
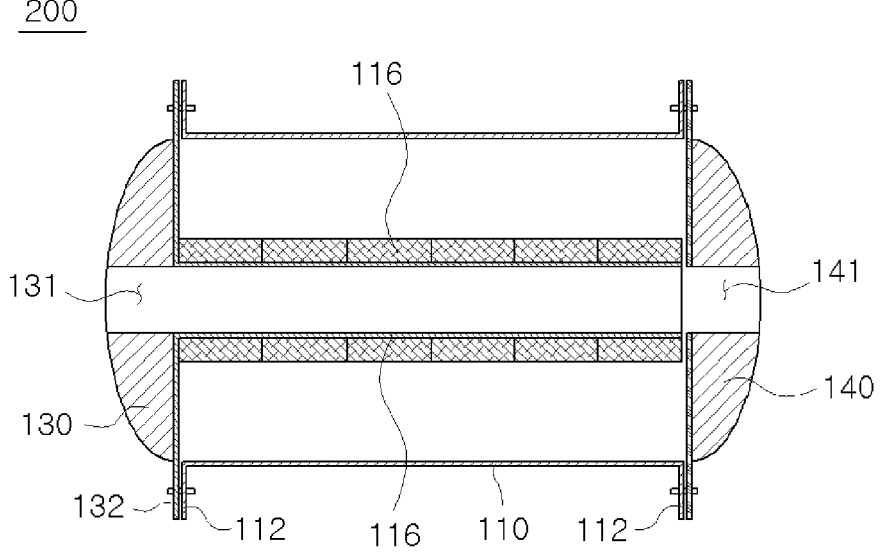
FIG. 4 is a sectional view of a heat exchange device using seawater according to the second embodiment of the present disclosure.

Referring to FIGS. 2 to 4, the heat exchange device 200 using seawater according to the second embodiment of the present disclosure may further include a body flange portion 112 and a cover flange portion 132.

The body flange portion 112 is installed at one end of the body portion 110 and an outer diameter thereof is formed to be larger than an outer diameter of the body portion 110. The cover flange portion 132 is installed between the first cover portion 130 and the pillar portion 120, and a diameter thereof is formed to be larger than that of the first cover portion 130. The cover flange portion 132 is coupled to the body flange portion 112. At this time, the cover flange portion 132 and the body flange portion 112 may be coupled to each other through a separate coupling pin.

On the other hand, although not shown in FIGS. 3 and 4, the auxiliary flow path portion 120k described in the first embodiment of the present disclosure may be provided in the second embodiment of the present disclosure. However, in this case, the auxiliary flow path portion 120k may be formed to protrude more outward than the body flange portion 112 with respect to the radial direction of the body portion 110 so that the seawater flows into the inside thereof.

In addition, in FIG. 4, the plurality of data center servers 116 are shown to be in contact with each other in the axial direction of the pillar portion 120, but this is only an example, and a disposition relationship of the plurality of data center servers 116 may be variously represented as shown in FIGS. 5 to 7.

Therefore, hereinafter, various disposition relationships of the plurality of data center servers 116 will be described.

Referring to FIG. 5, in the heat exchange device 300 using seawater according to the third embodiment of the present disclosure, the plurality of data center servers 116 may be disposed to be spaced apart from each other in the axial direction of the pillar portion 120. Referring to FIG. 6, in the heat exchange device 400 using seawater according to the fourth embodiment of the present disclosure, the plurality of data center servers 116 may be disposed so as to be in contact with each other in the axial direction of the pillar portion 120. Of course, the third embodiment of the present disclosure shown in FIG. 5 and the fourth embodiment of the present disclosure shown in FIG. 6 may be mixed with each other. That is, some of the plurality of data center servers 116 installed on the outer surface of the pillar portion 120 may be disposed to be spaced apart from each other in the axial direction of the pillar portion 120, and the other portions of the pillar portion 120 may be disposed so as to be in contact with each other in the axial direction of the pillar portion 120.

On the other hand, referring to FIG. 6, the heat exchange device 400 using seawater according to the fourth embodiment of the present disclosure may further include an auxiliary heat exchanger 122.

The auxiliary heat exchanger 122 is installed outside the data center servers 116 with respect to the radial direction of the body portion 110 and the seawater flowed into the auxiliary flow path portion 120k selectively flows therein. To this end, in the fourth embodiment of the present disclosure, connection means (not shown) for connecting the auxiliary flow path portion 120k and the auxiliary heat exchanger 122 may be further provided. Of course, the auxiliary heat exchanger 122 may also be provided in the third embodiment of the present disclosure shown in FIG. 5.

Referring to FIG. 7, in the heat exchange device 500 using seawater according to the fifth embodiment of the present disclosure, the data center servers 116 may be stacked in multiple stages in the radial direction of the body portion 110. In addition, the auxiliary heat exchanger 122 may be disposed between the data center server 116 and the data center server 116 adjacent to each other in the radial direction of the body portion 110.

In addition, the heat exchange device 500 using seawater according to the fifth embodiment of the present disclosure may further include an auxiliary connection portion 123. The auxiliary connection portion 123 connects the auxiliary heat exchanger 122 and the auxiliary heat exchanger 122 adjacent to each other in the circumferential direction of the body portion 110, when viewed in the axial direction of the body portion 110 (that is, when referring to FIG. 7). The data center server 116 may be additionally installed outside the auxiliary connection portion 123 in the radial direction.

Therefore, on the inside of the body portion 110, the seawater not only flows on each inside of the pillar portion 120 and the auxiliary heat exchanger 122 in the axial direction, but also flows each inside of the auxiliary heat exchanger 122 and the auxiliary connection portion 123 in the circumferential direction. According to the fifth embodiment of the present disclosure, data center servers 116 can be accommodated inside the body portion 110 more than the related art, and each data center server 116 can be effectively cooled.

Figure 8:
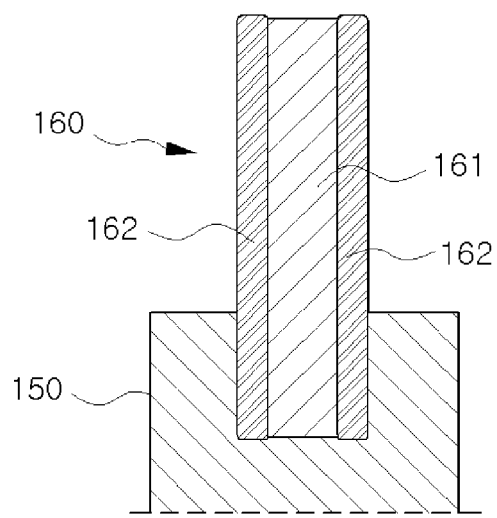
FIG. 8 is an enlarged view of a fin member and a heat pipe shown in FIG. 7.
Figure 9:
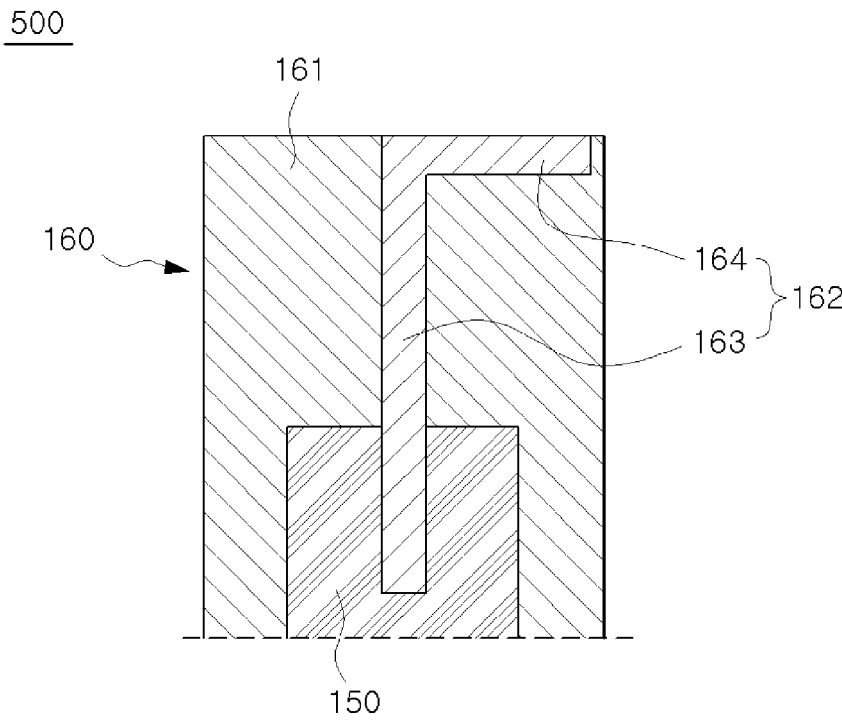
FIG. 9 is a view showing a state where

Referring to FIGS. 7 to 9, the heat exchange device 500 using seawater according to the fifth embodiment of the present disclosure may further include a seating portion 150 and a heat transfer portion 160.

The seating portion 150 is installed outside the data center server 116 disposed at the outermost side with respect to the radial direction of the body portion 110. The heat transfer portion 160 is installed radially outer side the seating portion 150 and is inserted into the auxiliary flow path portion 120k.

Referring to FIGS. 8 and 9, the heat transfer portion 160 includes a fin member 161 and a heat pipe 162. The fin member 161 is inserted outside the seating portion 150 and is inserted into the auxiliary flow path portion 120k. The heat pipe 162 is installed on a side surface of the fin member 161 when viewed in the axial direction of the body portion 110 (that is, when referring to FIG. 8). With such a structure, the fin member 161 and the heat pipe 162 smoothly move the heat generated in the data center server 116 and thereby, driving efficiency of the heat exchange device 500 according to the present disclosure can be improved.

At this time, when the heat transfer portion 160 is viewed from the side surface (that is, when referring to FIG. 9), the fin member 161 is formed to protrude from the seating portion 150 in the axial direction of the body portion 110. The heat pipe 162 includes a first pipe member 163 and a second pipe member 164. The first pipe member 163 is inserted into the seating portion 150 and is formed in a shape extending in the radial direction of the body portion 110. The second pipe member 164 is connected to a radially outer end of the first pipe member 163 and extends in the axial direction of the body portion 110.

According to the fifth embodiment of the present disclosure, a cooling load caused by the seawater flowing into the auxiliary flow path portion 120k through the heat transfer portion 160 is applied to the data center server 116 disposed at the outermost side. That is, the heat transfer portion 160 is cooled by the seawater flowing into the auxiliary flow path portion 120k and the data center server 116 disposed at the outermost side is also cooled by the cooled heat transfer portion 160. Therefore, according to the fifth embodiment of the present disclosure, the data center server 116 can be cooled more effectively.

Figure 10:
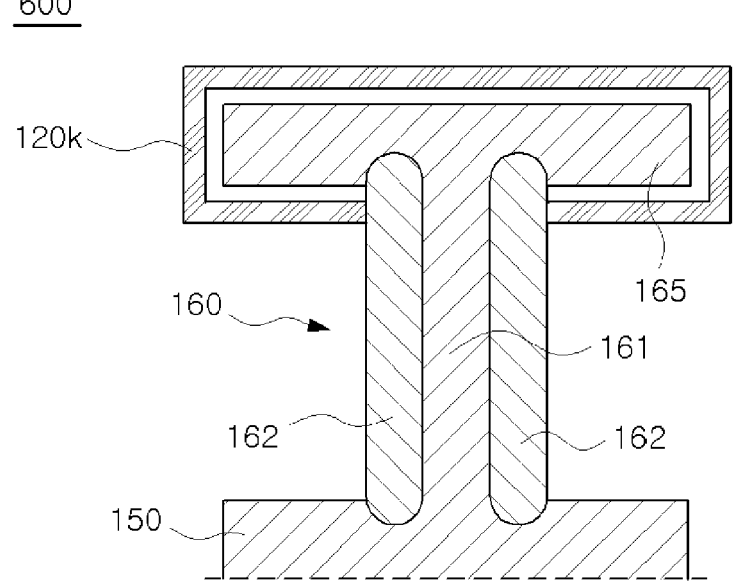
FIG. 10 is a view showing a state where a head member is coupled to a radially outer side of a fin member in a sixth embodiment of the present disclosure.

On the other hand, referring to FIG. 10, in the heat exchange device 600 using seawater according to the sixth embodiment of the present disclosure, the heat transfer portion 160 may further include a head member 165.

The head member 165 is coupled to the radially outer end of the fin member 161 and a reference width of the body portion 110 in the circumferential direction is larger than the width of the fin member 161. The head member 165 is inserted into the auxiliary flow path portion 120k. The radial outer end of the heat pipe 162 is inserted into a radially inner portion of the head member 165.

According to the sixth embodiment of the present disclosure described above, a contact area between the radial outer portion of the heat transfer portion 160 and the seawater flowing into the auxiliary flow path portion 120k is increased, so that the cooling efficiency applied form the seawater to the data center server 116 is increased. Therefore, the cooling efficiency of the data center server 116 can be improved. The head member 165 sits on an inner wall of the auxiliary flow path portion 120k so that a state where components such as the pillar portion 120, the data center server 116, the auxiliary heat exchanger 122, and the auxiliary connection portion 123 are more firmly disposed inside the body portion 110 can be maintained.

Figure 11:
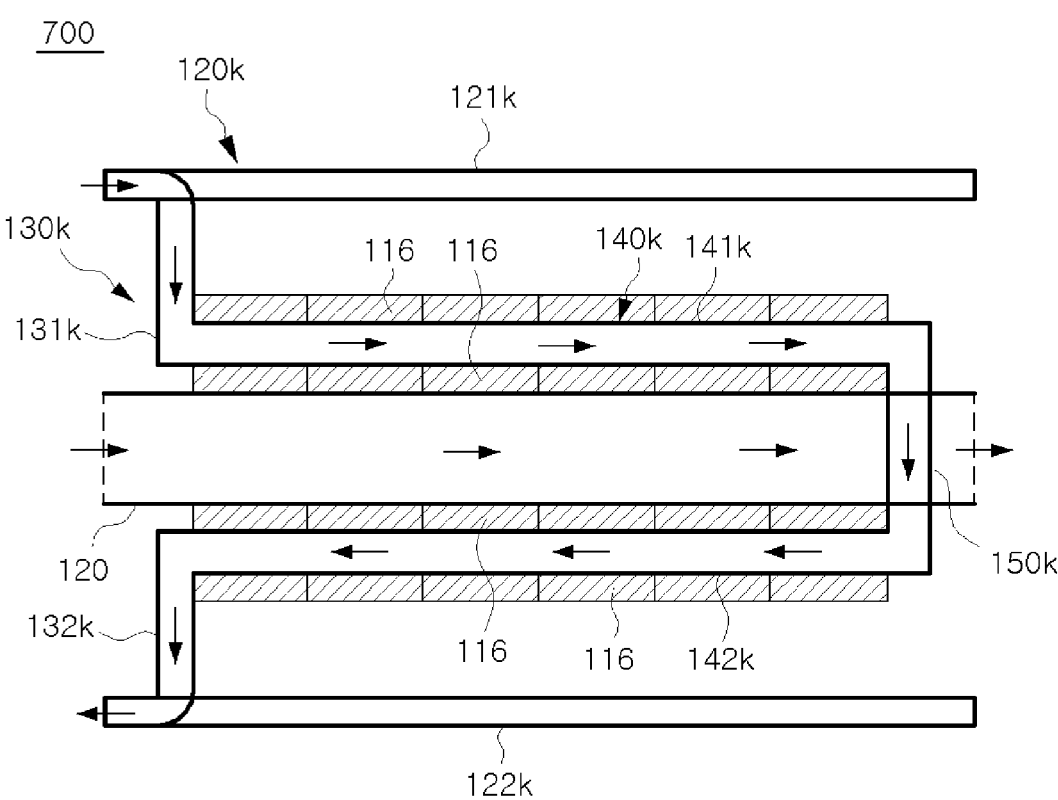
FIG. 11 is a sectional view of the heat exchange device using seawater shown in FIG. 1 and is a view showing a seventh embodiment of the present disclosure.
Figure 12:
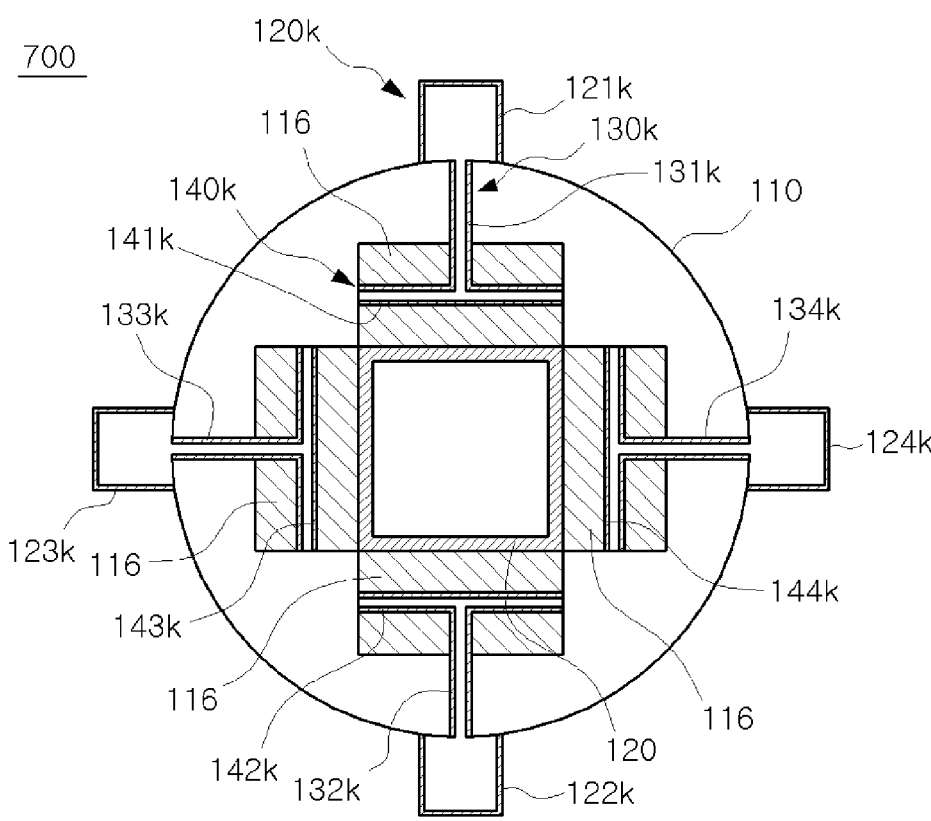
FIG. 12 is a sectional view showing the heat exchange device using seawater shown in FIG. 1 as viewed in an axial direction.

Referring to FIGS. 1, 11, and 12, the heat exchange device 700 using seawater according to a seventh embodiment of the present disclosure includes a body portion 110, a pillar portion 120k, and a first cover portion 130, an auxiliary flow path portion 120k, a connection portion 130k, an auxiliary supply portion 140k, and a communication pipe portion 150k.

The body portion 110 is formed in a hollow cylindrical shape.

The pillar portion 120k is formed in a hollow pipe shape and is accommodated inside the body portion 110. In FIG. 1, the pillar portion 120k is shown as having a square pillar shape, but this is only an example, and the pillar portion 120k may be formed in various shapes such as a cylinder, a triangular pillar shape, and a pentagonal pillar shape. The data center server 116 is installed on the outer surface of the pillar portion 120k.

The first cover portion 130 is coupled to one end of the pillar portion 120 and is detachably installed at one end of the body portion 110. More particularly, the first cover portion 130 has a first cover hole 131 formed through the center thereof, and communicates with the inside of the pillar portion 120. In addition, the seawater flows from the sea into the pillar portion 120 through the cover hole 131. As shown in FIG. 1, the first cover portion 130 may have a hemispherical shape, but is not limited thereto.

The auxiliary flow path portion 120k is installed on the outer circumferential surface of the body portion 110 and is disposed parallel to the pillar portion 120k. In addition, the auxiliary flow path portion 120k has a hollow shape, or the seawater is discharged to the sea therethrough. In FIG. 1 or 12, the auxiliary flow path portion 120k is shown as having a square pillar shape, but this is only an example, and the auxiliary flow path portion 120k may be formed in various shapes. The auxiliary flow path portion 120k includes a first auxiliary flow path portion 121k and a second auxiliary flow path portion 122k. The first auxiliary flow path portion 121k and the second auxiliary flow path portion 122k are disposed with the body portion 110 interposed therebetween. Referring to FIG. 11, the first auxiliary flow path portion 121k is disposed above the body portion 110 and the second auxiliary flow path portion 122k is disposed below the body portion 110.

The connection portion 130k is accommodated inside the body portion 110 and is installed at one end of the auxiliary flow path portion 120k. In addition, the connection portion 130k supplies the seawater to the data center server 116 side. The connection portion 130k includes a first connection portion 131k and a second connection portion 132k. The first connection portion 131k is installed in the first auxiliary flow path portion 121k and the second connection portion 132k is installed in the second auxiliary flow path portion 122k.

Referring to FIGS. 11 and 12, the data center servers 116 are stacked on the outside of the pillar portion 120k in multiple stages with respect to the radial direction of the body portion 110. The auxiliary supply portion 140k is installed between the data center server 116 and the data center server 116 adjacent to each other with respect to the radial direction of the body portion 110, and one end thereof is connected to the connection portion 130k. The auxiliary supply portion 140k may correspond to the same component as the auxiliary heat exchanger 122 shown in FIG. 7. The auxiliary supply portion 140k includes a first auxiliary supply portion 141k and a second auxiliary supply portion 142k. The first auxiliary supply portion 141k is connected to the first connection portion 131k and the second auxiliary supply portion 142k is connected to the second connection portion 132k. As shown in FIGS. 11 and 12, the first auxiliary flow path portion 121k, the first connection portion 131k, and the first auxiliary supply portion 141k may be respectively disposed to be symmetrical with the second auxiliary flow path portion 122k, the second connection portion 132k, and the second auxiliary supply portion 142k, with the pillar portion 120k interposed therebetween.

On the other hand, referring to FIG. 12, the auxiliary flow path portion 120k further includes a third auxiliary flow path portion 123k and a fourth auxiliary flow path portion 124k. The connection portion 130k may further include a third connection portion 133k and a fourth connection portion 134k, and the auxiliary supply portion 140k may further include a third auxiliary supply portion 143k and a fourth auxiliary supply portion 144k. However, this is an example, and the auxiliary flow path portion 120k may further include an nth auxiliary flow path portion (not shown, n is a natural number equal to or greater than 5), and the connection portion 130k may further include an nth connection portion (not shown, n is a natural number equal to or greater than 5), and the auxiliary supply portion 140k may further include an nth auxiliary supply portion (not shown, n is a natural number equal to or greater than 5).

Referring to FIGS. 11 and 12, the first connection portion 131k communicates with one end of the first auxiliary flow path portion 121k and the second connection portion 132k communicates with one end of the second auxiliary flow path portion 122k. The communication pipe portion 150k communicates the other end of the first auxiliary supply portion 141k and the other end of the second auxiliary supply portion 142k with each other. At this time, although not shown in the drawings, the communication pipe portion 150k is disposed so as to surround the outer surface of the pillar portion 120k at the other end of the pillar portion 120k.

In the seventh embodiment of the present disclosure, the seawater flowed into one end of the first auxiliary flow path portion 121k sequentially flows along the first connection portion 131k, the first auxiliary supply portion 141k, the communication pipe portion 150k, the second auxiliary supply portion 142k, the second connection portion 132k, and the second auxiliary flow path portion 122k, and then is discharged to the sea.

According to the present disclosure as described above, the seawater flowed from the sea to the inside of the pillar portion 120k cools the data center servers 116 and at the same time, the seawater flowed from the sea into the auxiliary flow path portion 120k and the connection portion 130k cools the data center servers 116, and then is discharged to the sea. Therefore, according to the present disclosure, it is possible to effectively cool the data center servers 116.

Hereinafter, eighth to thirteenth embodiments of the present disclosure will be described with reference to FIGS. 13 to 22. At this time, only portions that are different from those in the seventh embodiment of the present disclosure will be described.

Figure 13:
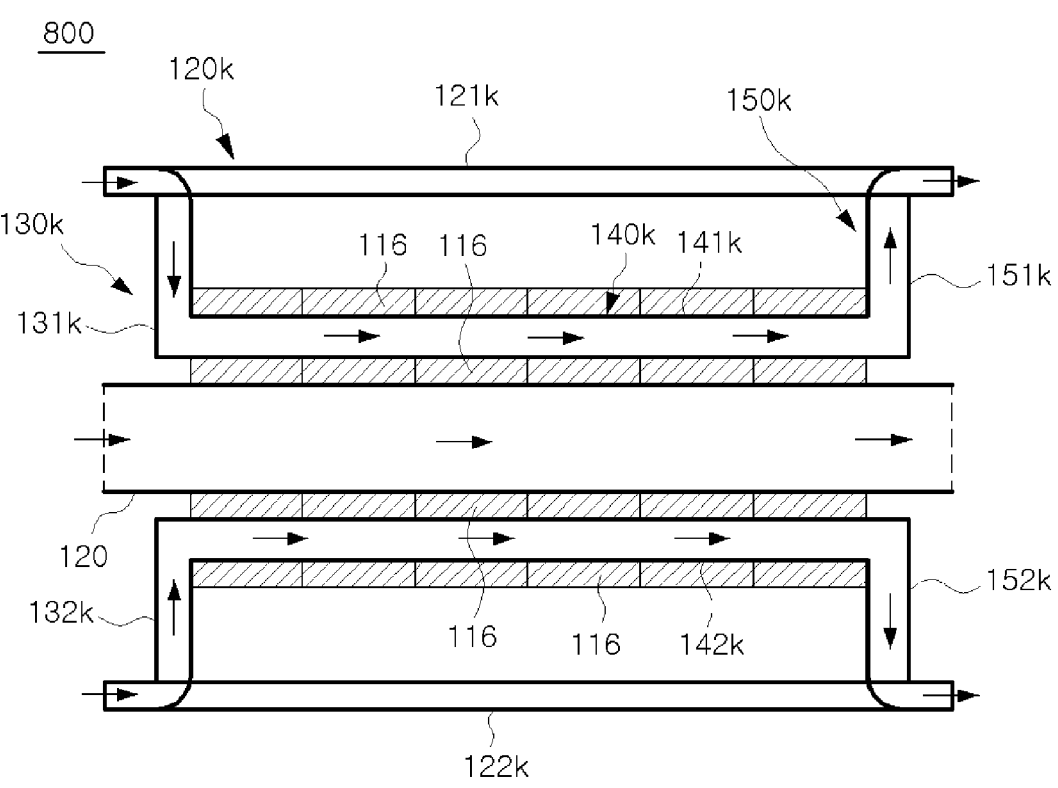
FIG. 13 is a view showing an eighth embodiment of the present disclosure.

Referring to FIG. 13, in a heat exchange device 800 using seawater according to the eighth embodiment of the present disclosure, the communication pipe portion 150*k* includes a first communication pipe portion 151*k* and a second communication pipe portion 152*k*. The first communication pipe portion 151*k* communicates the other end of the first auxiliary flow path portion 121*k* and the other end of the first auxiliary supply portion 141*k* with each other. The second communication pipe portion 152*k* communicates the other end of the second auxiliary flow path portion 122*k* and the other end of the second auxiliary supply portion 142*k* with each other.

In the eighth embodiment of the present disclosure, the seawater flowed into one end of the first auxiliary flow path portion 121*k* sequentially flows along the first connection portion 131*k*, the first auxiliary supply portion 141*k*, and the first communication pipe portion 151*k*, and the other end of the first auxiliary flow path portion 121*k*, and then is discharged to the sea. Similarly, the seawater flowed into one end of the second auxiliary flow path portion 122*k* sequentially flows along the second connection portion 132*k*, the second auxiliary supply portion 142*k*, the second communication pipe portion 152*k*, and the other end of the second auxiliary flow path portion 122*k*, and then is discharged to the sea.

Figure 14:
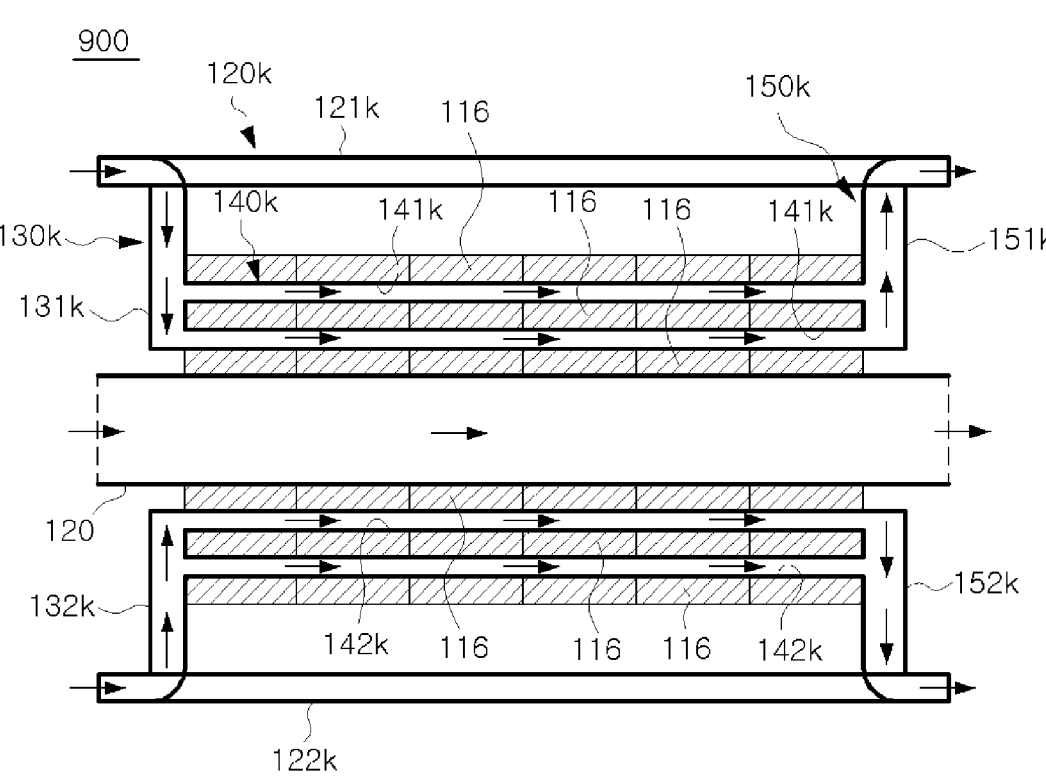
FIG. 14 is a view showing a ninth embodiment of the present disclosure.

Referring to FIG. 14, in a heat exchange device 900 using seawater according to the ninth embodiment of the present disclosure, the data center servers 116 are stacked in three or more layers, and two or more, that is, a plurality of auxiliary supply portions 140*k* may be provided between respective data center servers 116.

Figure 15:
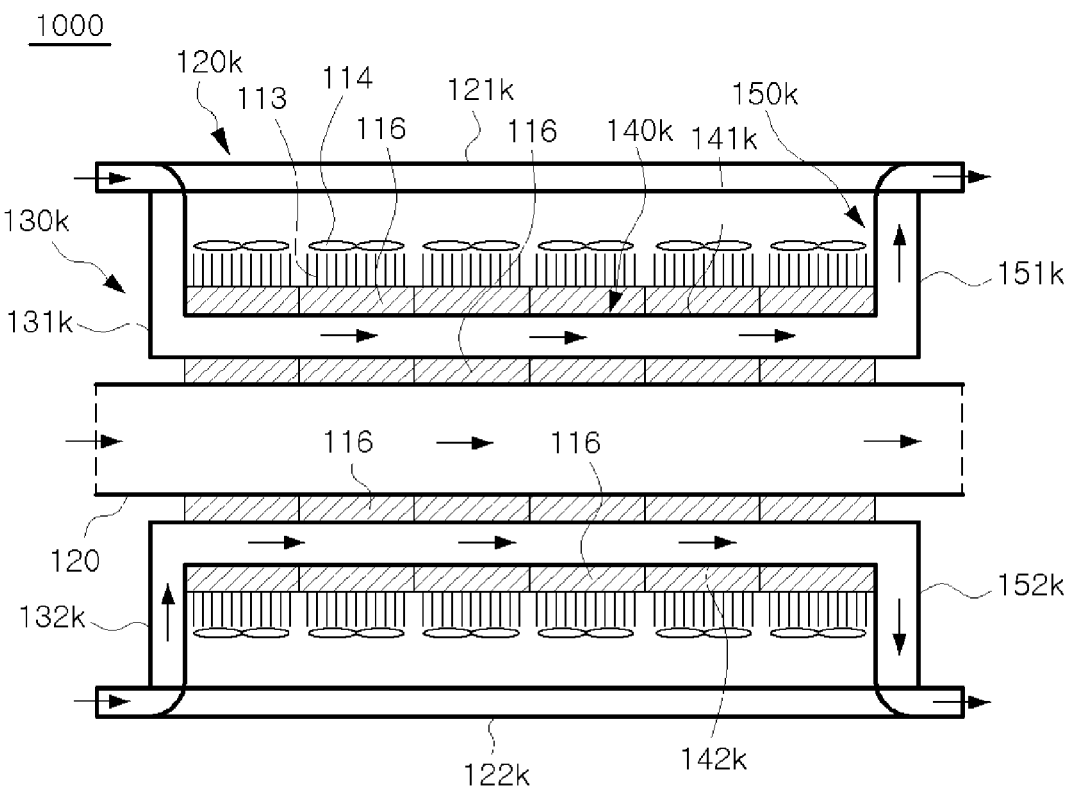
FIG. 15 is a view showing a tenth embodiment of the present disclosure.

Referring to FIG. 15, a heat exchange device 1000 using seawater according to the tenth embodiment of the present disclosure may further include a heat sink 113 and a cooling fan 114. The heat sink 113 is installed on the outer surfaces of the data center server 116 disposed at the outermost side with respect to the radial direction of the body portion 110. The cooling fan 114 is installed on the heat sink 113 and cools the heat sink 113. To this end, the cooling fan 114 may be connected to a separate power source (not shown).

On the other hand, although FIGS. 14 and 15 show that the ninth and tenth embodiments of the present disclosure are applied to the eighth embodiment of the present disclosure shown in FIG. 13, this is only an example, and features of the ninth and tenth embodiments of the present disclosure can also be applied to the seventh embodiment of the present disclosure shown in FIG. 11.

Figure 16:
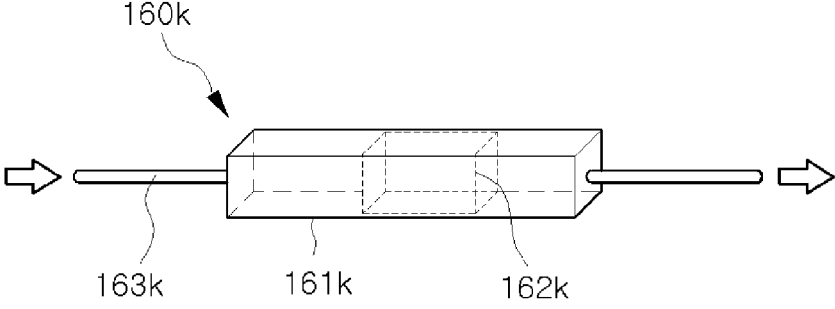
FIG. 16 is a view showing a distribution heat exchanger provided in an eleventh embodiment of the present disclosure.
Figure 17:
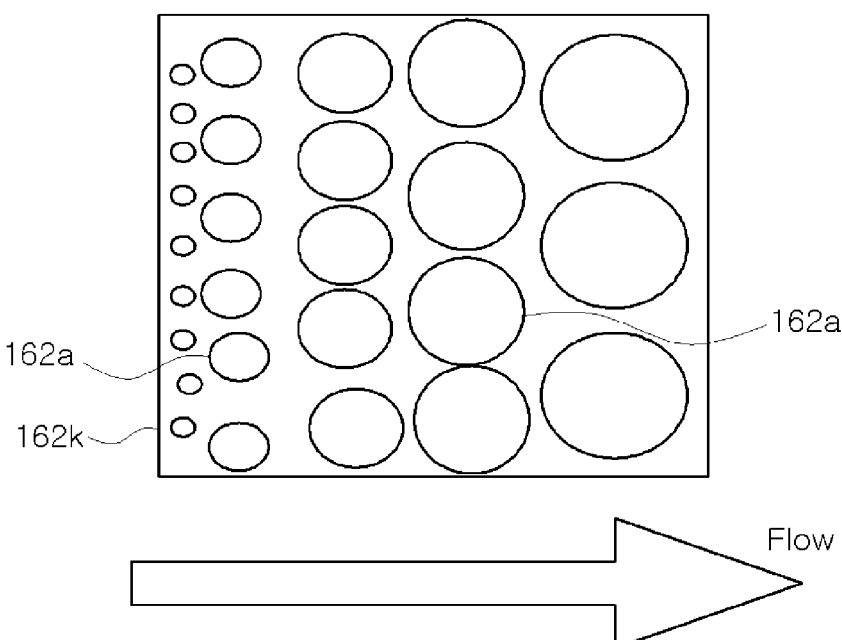
FIG. 17 is a view showing an internal structure of a distribution block shown in FIG. 16.

Referring to FIGS. 16 and 17, a heat exchange device 1100 using seawater according to the eleventh embodiment of the present disclosure may further include a distribution heat exchanger 160*k*. The distribution heat exchanger 160*k* is installed in the auxiliary supply portion 140*k* and includes a distribution block 161*k* and a distribution pipe 163*k*. The distribution block 161*k* is installed in the auxiliary supply portion 140*k* and a plurality of distribution members 162*k* which are accommodated therein. The distribution block 161*k* may be formed of any one of copper, aluminum, and stainless steel, but is not limited thereto. The distribution member 162*k* has a plurality of pores 162*a* formed therein. As shown in FIG. 17, the plurality of pores 162*a* may be formed in a shape that gradually increases in size in the flow direction of the seawater. The seawater flowing inside the auxiliary supply portion 140*k* flows through the plurality of distribution members 162*k* and the plurality of distribution members 162*k* distribute the heat of the seawater to heat-exchange more smoothly between the seawater and the adjacent data center servers 116. The distribution pipe 163*k* is connected to the distribution block 161*k*, and seawater flows in and out therefrom.

Figure 18:
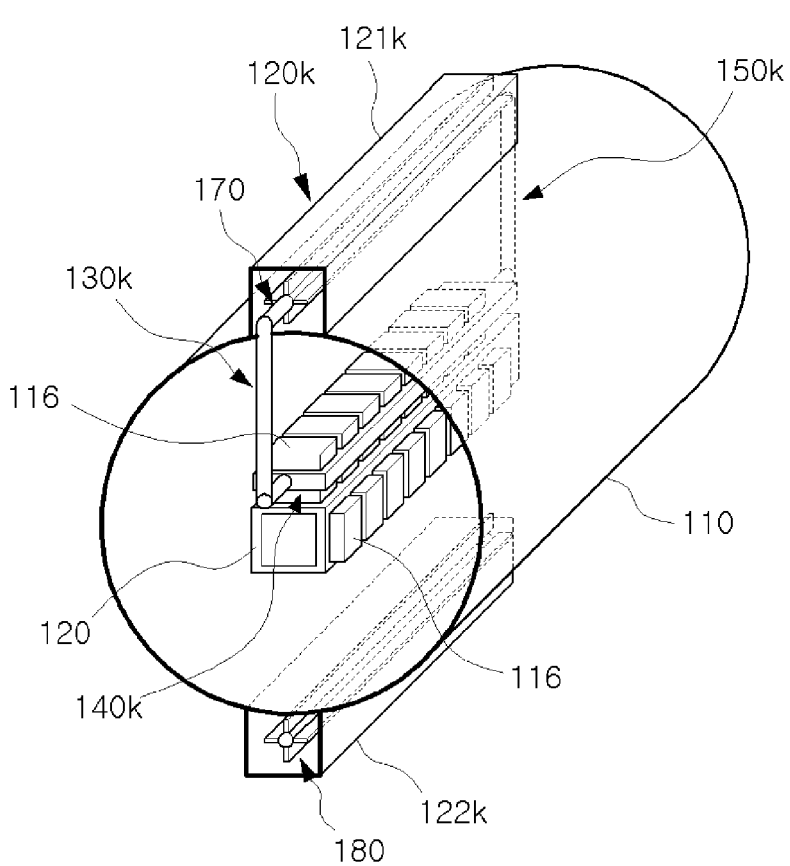
FIG. 18 is a perspective view of a heat exchange device using seawater according to a twelfth embodiment of the present disclosure.
Figure 19:
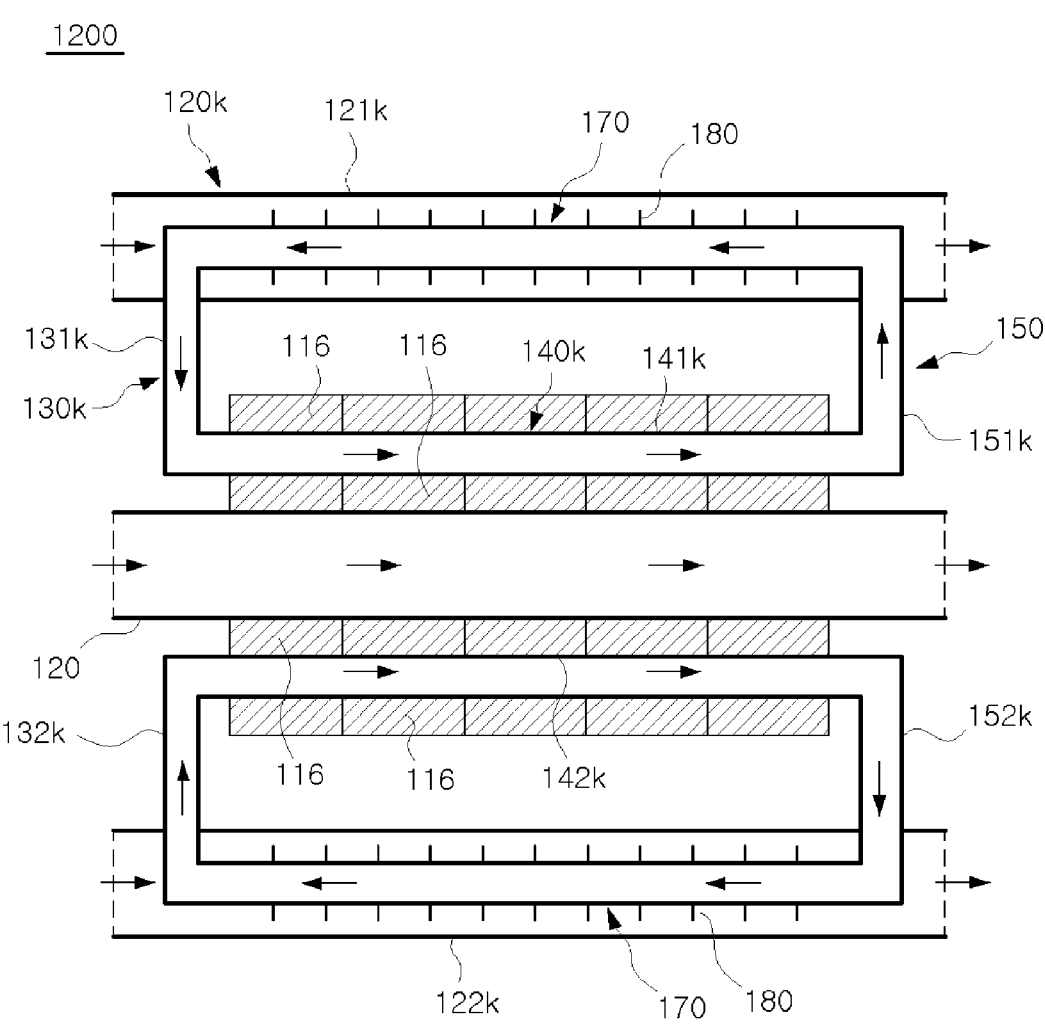
FIG. 19 is a sectional view of FIG. 18.
Figure 20:
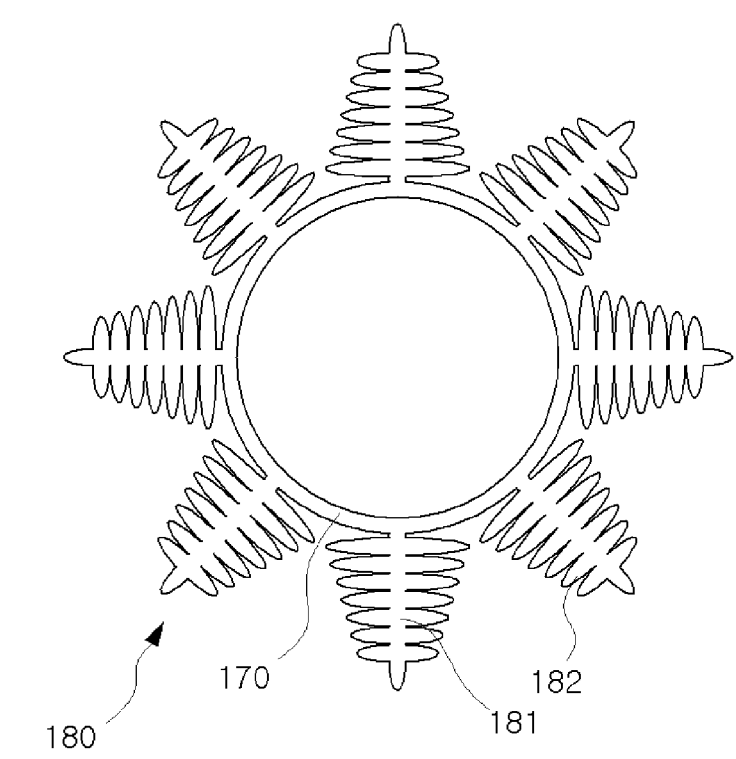
FIG. 20 is a sectional view of a heat exchange protrusion portion shown in FIG. 18.

Referring to FIGS. 18 to 20, a heat exchange device 1200 using seawater according to the twelfth embodiment of the present disclosure may further include a closed flow path portion 170 and a plurality of heat exchange protrusion portions 180.

Unlike the seventh and eighth embodiments of the present disclosure, in the twelfth embodiment of the present disclosure, the connection portion 130*k* communicates with the closed flow path portion 170 rather than with the auxiliary flow path portion 120*k*. More particularly, the closed flow path portion 170 has one end connected to the connection portion 130*k* and the other end connected to the communicating pipe portion 150*k*. Therefore, in the twelfth embodiment of the present disclosure, a closed flow path is formed through the closed flow path portion 170, the connection portion 130*k*, the auxiliary supply portion 140*k*, and the communication pipe portion 150*k*, and the seawater present inside the closed flow path portion 170 is not discharged to the sea, but continuously circulates through the closed flow path portion 170, the connection portion 130*k*, the auxiliary supply portion 140*k*, and the communication pipe portion 150*k*. In addition, the seawater flowed into one end of the auxiliary supply portion 140*k* flows along the outer surface of the closed flow path portion 170, and then is discharged to the sea through the other end of the auxiliary flow path portion 120*k*.

The plurality of heat exchange protrusion portions 180 are installed on an outer circumferential surface of the closed flow path portion 170 and are disposed to be spaced apart from each other in a circumferential direction of the closed flow path portion 170. The heat exchange protrusion portion 180 includes a protrusion member 181 and a plurality of auxiliary protrusion members 182. The protrusion member 181 protrudes outward in the radial direction of the closed flow path portion 170. At this time, referring to FIG. 20, the protrusion member 181 is formed in a shape in which a circumferential reference width of the closed flow path portion 170 decreases gradually toward the outside in the radial direction of the closed flow path portion 170. For example, the closed flow path portion 170 may have a triangular cross section. The plurality of auxiliary protrusion members 182 protrude from the outer surface of the protrusion member 181. As described above, in a case where the plurality of heat exchange protrusion portions 180 are provided on the outer circumferential surface of the closed flow path portion 170, a contact area between the seawater flowing into the auxiliary flow path portion 120*k* and the plurality of heat exchange protrusion portions 180 can be increased. Therefore, by using the seawater flowing into the auxiliary flow path portion 120*k*, the seawater circulating through the closed flow path portion 170, the connection portion 130*k*, the auxiliary supply portion 140*k*, and the communication pipe portion 150*k* can be cooled more effectively.

Figure 21:
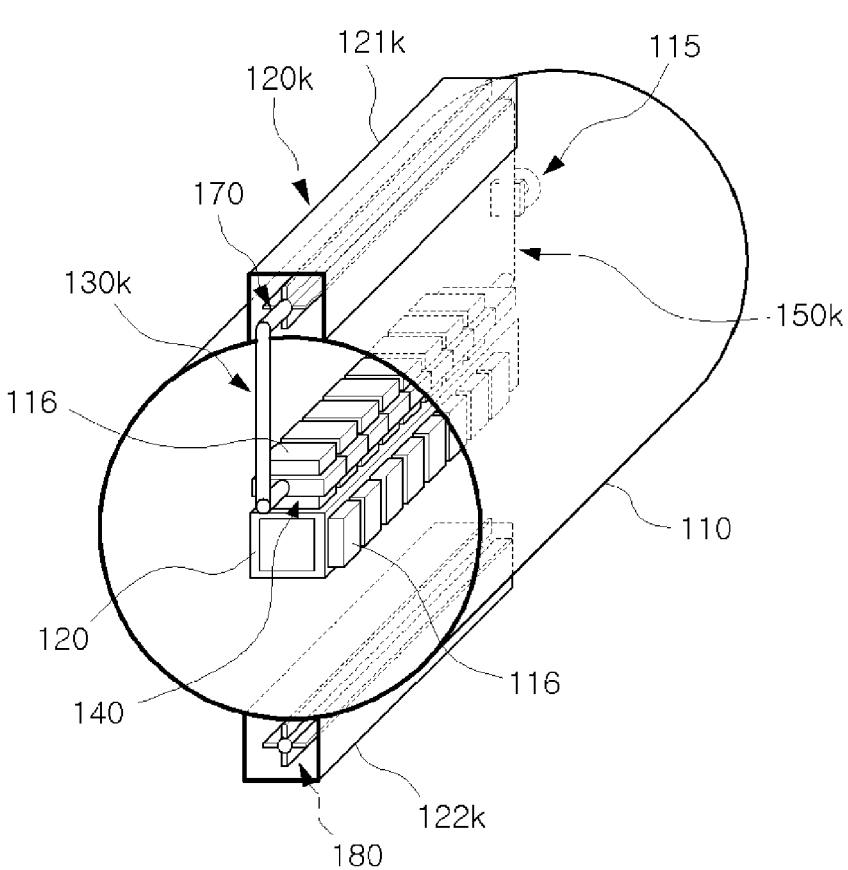
FIG. 21 is a perspective view of a heat exchange device using seawater according to a thirteenth embodiment of the present disclosure.
Figure 22:
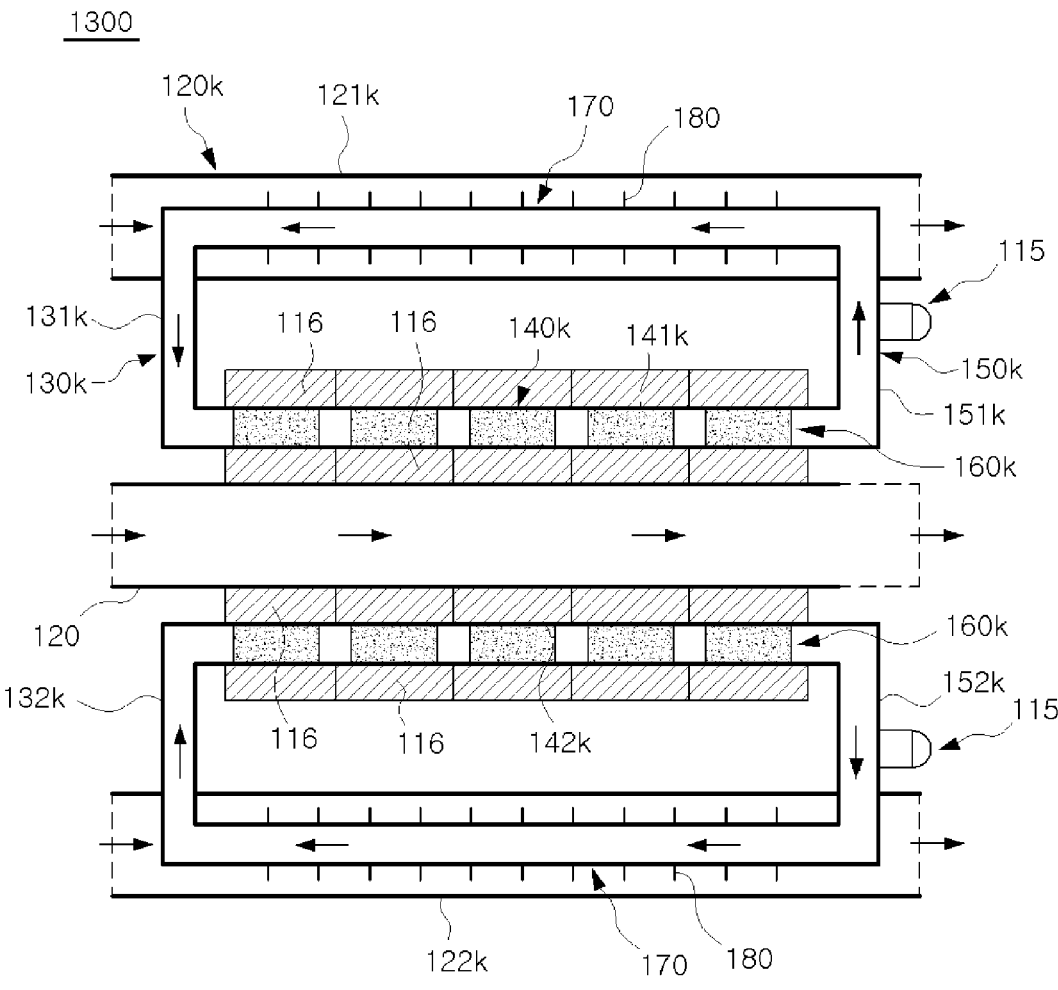
FIG. 22 is a sectional view of FIG. 11.

Referring to FIGS. 21 and 22, a heat exchange device 1300 using seawater according to the thirteenth embodiment of the present disclosure may further include a pump 115. The pump 115 is installed in the communication pipe portion 150*k* and pressurizes the seawater circulating through the closed flow path portion 170, the connection portion 130*k*, the auxiliary supply portion 140*k*, and the communication pipe portion 150*k*. On the other hand, as shown in FIGS. 21 and 22, in the thirteenth embodiment of the present disclosure, the distribution heat exchanger 160k shown in FIGS. 16 and 17 may be additionally provided.

On the other hand, the technical features of the first to thirteenth embodiments of the present disclosure described above are not dedicated to any one embodiment, and it will be understood that each embodiment may be used in combination with each other.

The invention claimed is:

1. A heat exchange device using seawater comprising:
a body portion having a hollow shape;
a pillar portion which is disposed inside the body portion and has a hollow shape, in which a data center server is installed, and into which seawater flows;
a first cover portion to which one end of the pillar portion is coupled, and which is detachably installed at one end of the body portion; and
a hollow-shaped auxiliary heat exchanger which is installed on an outside of the data center server with respect to a radial direction of the body portion and into which the seawater flowed into an auxiliary flow path portion selectively flows,
wherein a plurality of data center servers are stacked in multiple stages in the radial direction of the body portion, and
wherein the auxiliary heat exchanger is disposed between the data center servers adjacent to each other with respect to the radial direction of the body portion.

2. The heat exchange device using seawater according to claim 1,
wherein the first cover portion is formed in a hemispherical shape.

3. The heat exchange device using seawater according to claim 1,
wherein the first cover portion is provided with a first cover hole communicating with an inside of the pillar portion.

4. The heat exchange device using seawater according to claim 1, further comprising:
a second cover portion which is coupled to the other end of the body portion and into which a second cover hole communicating with the inside of the pillar portion is formed.

5. The heat exchange device using seawater according to claim 1,
wherein the pillar portion is formed in a prism shape and is provided with a data center server on an outer surface.

6. The heat exchange device using seawater according to claim 1, further comprising:
an auxiliary flow path portion which is installed on an outer peripheral surface of the body portion and has a hollow shape, and through which the seawater flows in.

7. The heat exchange device using seawater according to claim 1, further comprising:
a cover flange portion installed between the first cover portion and the pillar portion; and
a body flange portion installed at one end of the body portion and coupled to the cover flange portion.

8. The heat exchange device using seawater according to claim 1, further comprising:
an auxiliary connection portion which connects a plurality of auxiliary heat exchangers that are arranged adjacent to one another in a circumferential direction of the body portion, and in which the data center servers are installed radially outer side when viewed in an axial direction of the body portion.

9. The heat exchange device using seawater according to claim 6, further comprising:
a seating portion installed on the outside of the data center server with respect to the radial direction of the body portion; and
a heat transfer portion installed on an outside of the seating portion and inserted into the auxiliary flow path portion.

10. The heat exchange device using seawater according to claim 9,
wherein the heat transfer portion includes
a fin member inserted to the outside the seating portion; and
a heat pipe installed on a side surface of the fin member when viewed in the axial direction of the body portion.

11. The heat exchange device using seawater according to claim 10,
wherein when viewed from the side surface of the heat transfer portion,
the fin member is formed in a shape protruding from the seating portion in the axial direction of the body portion, and
wherein the heat pipe includes
a first pipe member inserted into the seating portion and extending in the radial direction of the body portion; and
a second pipe member connected to a radial outer end of the first pipe member and extending in the axial direction of the body portion.

12. The heat exchange device using seawater according to claim 10,
wherein the heat transfer portion further comprising:
a head member coupled to a radial outer end of the fin member and having a reference width in the circumferential direction of the body portion, which is larger than the fin member, and
wherein a radial outer end of the heat pipe is inserted into a radially inner portion of the head member.

13. A heat exchange device using seawater comprising:
a body portion;
a pillar portion which is accommodated inside the body portion and has a hollow shape, into which seawater flows, and in which the data center servers are installed;
an auxiliary flow path portion installed on an outer surface of the body portion and having a hollow shape;
a connection portion accommodated inside the body portion, installed at one end of the auxiliary flow path portion, and supplying the seawater to the data center,
a seating portion installed on the outside of the data center server with respect to the radial direction of the body portion; and
a heat transfer portion installed on an outside of the seating portion and inserted into the auxiliary flow path portion.

14. The heat exchange device using seawater according to claim 13,
wherein the data center servers are stacked in multiple stages on an outside of the pillar portion with respect to a radial direction of the body portion, and
wherein the heat exchange device using seawater further comprising:
an auxiliary supply portion installed between the data center server and the data center server adjacent to each other with respect to the radial direction of the body portion having one end connected to the connection portion.

15. The heat exchange device using seawater according to claim 14, wherein the auxiliary flow path portion includes a first auxiliary flow path portion and a second auxiliary flow path portion disposed with the body portion interposed therebetween, wherein the connection portion includes a first connection portion and a second connection portion respectively installed in the first auxiliary flow path portion and the second auxiliary flow path portion, and wherein the auxiliary supply portion includes a first auxiliary supply portion and a second auxiliary supply portion respectively connected to the first connection portion and the second connection portion.

16. The heat exchange device using seawater according to claim 15, wherein, the first connection portion and the second connection portion are in communication with one end of the first auxiliary flow path portion and one end of the second auxiliary flow path portion, respectively, wherein the heat exchange device using seawater further comprising:

a communication pipe portion which communicates the other end of the first auxiliary supply portion and the other end of the second auxiliary supply portion with each other, and is disposed to surround an outer surface of the other end side of the pillar portion, and wherein the seawater flowed into one end of the first auxiliary flow path portion sequentially flows along the first connection portion, the first auxiliary supply portion, the communication pipe portion, the second auxiliary supply portion, the second connection portion, and the second auxiliary flow path portion, and then is discharged to the sea.

17. The heat exchange device using seawater according to claim 15, wherein the first connection portion communicates with one end of the first auxiliary flow path portion, wherein the heat exchange device using seawater further comprising: a first communication pipe portion for communicating the other end of the first auxiliary flow path portion and the other end of the first auxiliary supply portion with each other, and wherein the seawater flowed into one end of the first auxiliary flow path portion sequentially flows along the first connection portion, the first auxiliary supply portion, the first communication pipe portion, and the other end of the first auxiliary flow path portion, and then is discharged to the sea.

18. The heat exchange device using seawater according to claim 14, wherein the data center servers are stacked in three or more layers, and wherein two or more, that is, a plurality of the auxiliary supply portions are provided.

19. The heat exchange device using seawater according to claim 13, further comprising:

a heat sink installed on the outer surface of data center server disposed at the outermost side with respect to the radial direction of the body portion; and a cooling fan installed on the heat sink and cooling the heat sink.

20. The heat exchange device using seawater according to claim 14, further comprising:

a distribution heat exchanger installed in the auxiliary supply portion, wherein the distribution heat exchanger includes a distribution block having a plurality of distribution members in an inner space, and a distribution pipe which is connected to the distribution block and through which the seawater flows in and out.

21. The heat exchange device using seawater according to claim 15, further comprising:

a first communication pipe portion communicating with the other end of the first auxiliary supply portion and installed at the other end of the first auxiliary flow path portion; and a closed flow path portion accommodated inside the first auxiliary flow path portion and communicating the first connection portion and the first communication pipe portion with each other, wherein the seawater flowed into one end of the first auxiliary flow path portion flows along an outer surface of the closed flow path portion and then is discharged to the sea through the other end of the first auxiliary flow path portion, and wherein the seawater present inside the closed flow path portion circulates along the first connection portion, the first auxiliary supply portion, the first communication pipe portion, and the closed flow path portion.

22. The heat exchange device using seawater according to claim 21, further comprising:

a pump installed in the first communication pipe portion and pressurizing the seawater circulating along the first connection portion, the first auxiliary supply portion, the first communication pipe portion, and an inside of the closed flow path portion.

23. The heat exchange device using seawater according to claim 21, further comprising:

a plurality of heat exchange protrusion portions installed on an outer surface of the closed flow path portion and spaced apart from each other in a circumferential direction of the closed flow path portion.

24. The heat exchange device using seawater according to claim 23, wherein the heat exchange protrusion portion includes a protrusion member protruding outward in the radial direction of the closed flow path portion; and a plurality of auxiliary protrusion members protruding from an outer surface of the protrusion member.

25. The heat exchange device using seawater according to claim 24, wherein the protrusion member is formed in a shape in which a reference width of the closed flow path portion in the circumferential direction gradually decreases toward the radial outer side of the closed flow path portion.

\* \* \* \* \*